United States Patent
Nagahama et al.

(10) Patent No.: US 12,213,382 B2
(45) Date of Patent: Jan. 28, 2025

(54) COMPOSITION FOR FORMING POLYVINYLIDENE FLUORIDE FILM

(71) Applicant: NISSAN CHEMICAL CORPORATION, Tokyo (JP)

(72) Inventors: Takuma Nagahama, Funabashi (JP); Shinichi Maeda, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 742 days.

(21) Appl. No.: 17/427,195

(22) PCT Filed: Jan. 27, 2020

(86) PCT No.: PCT/JP2020/002654
§ 371 (c)(1),
(2) Date: Jul. 30, 2021

(87) PCT Pub. No.: WO2020/158635
PCT Pub. Date: Aug. 6, 2020

(65) Prior Publication Data
US 2022/0158077 A1   May 19, 2022

(30) Foreign Application Priority Data

Jan. 31, 2019 (JP) .................... 2019-015190

(51) Int. Cl.
*H10N 30/857* (2023.01)
*C08F 14/22* (2006.01)
*C08J 5/18* (2006.01)
*C08K 5/41* (2006.01)
*C08K 5/42* (2006.01)
*H10N 30/098* (2023.01)

(52) U.S. Cl.
CPC .......... *H10N 30/857* (2023.02); *C08F 14/22* (2013.01); *C08J 5/18* (2013.01); *C08K 5/41* (2013.01); *C08K 5/42* (2013.01); *H10N 30/098* (2023.02); *C08J 2327/16* (2013.01)

(58) Field of Classification Search
CPC .. C08F 14/22; C08K 5/41; C08K 5/42; C08K 5/19; C08J 2327/16; C09D 127/16
See application file for complete search history.

(56) References Cited

U.S. PATENT DOCUMENTS

| | | | |
|---|---|---|---|
| 6,017,639 A * | 1/2000 | Higginbotham | C09D 127/16 |
| | | | 428/458 |
| 6,610,766 B1 | 8/2003 | Kitamura et al. | |
| 2008/0203619 A1* | 8/2008 | Lanceros-Mendez | C08J 5/18 |
| | | | 264/435 |
| 2009/0263671 A1 | 10/2009 | Yao et al. | |
| 2014/0102533 A1 | 4/2014 | Hosoda et al. | |
| 2016/0264742 A1* | 9/2016 | Kou | C08J 5/18 |

FOREIGN PATENT DOCUMENTS

| | | |
|---|---|---|
| CN | 104226124 A  * | 12/2014 |
| JP | 11-323052 A | 11/1999 |
| JP | 2005-350621 A | 12/2005 |
| JP | 2010-13595 A | 1/2010 |
| JP | 2010-45059 A | 2/2010 |
| JP | 2019-172787 A | 10/2019 |
| PT | 103318 B * | 7/2005 |
| WO | WO 2012/172876 A1 | 12/2012 |

OTHER PUBLICATIONS

Machine translation of CN 104226124 (Year: 2014).*
Chinya et al., "Improved dielectric and touch sensing performance of surface modified zinc ferrite(ZF)/Polyvinylidene fluoride (PVDF) composite", Sensors and Actuators A, 2017, vol. 267, p. 301-309, total 10 pages.
International Search Report, issued in PCT/JP2020/002654, PCT/ISA/210, dated Feb. 25, 2020.
Written Opinion of the International Searching Authority, issued in PCT/JP2020/002654, PCT/ISA/237, dated Feb. 25, 2020.

* cited by examiner

*Primary Examiner* — Doris L Lee
(74) *Attorney, Agent, or Firm* — Birch, Stewart, Kolasch & Birch, LLP

(57) ABSTRACT

The present invention provides a composition for forming a polyvinylidene fluoride film, which contains: a polyvinylidene fluoride; at least one surfactant that is selected from among sulfuric acid-based surfactants, sulfonic acid-based surfactants and quaternary ammonium salt type surfactants; and a solvent.

12 Claims, No Drawings

COMPOSITION FOR FORMING POLYVINYLIDENE FLUORIDE FILM

TECHNICAL FIELD

The present invention relates to a composition for forming a polyvinylidene fluoride film.

BACKGROUND ART

Polyvinylidene fluoride (PVDF) has three types of crystal structures of a type, β type, and γ type. Among these crystal polymorphs of PVDF, a β-type crystal (β-crystal) is known to have maximum spontaneous polarization per unit lattice and exhibit high ferroelectricity and piezoelectric properties (Patent Document 1).

It has been shown that the β-type crystallization rate (β-crystallization rate) of PVDF is improved by forming a PVDF film on a substrate using a PVDF solution containing aluminum nitrate nonahydrate or magnesium nitrate hexahydrate (Patent Document 1). However, since improvement of ferroelectricity and piezoelectric properties is expected by improvement of the β-crystallization rate, further improvement is required.

PRIOR ART DOCUMENTS

Patent Documents

Patent Document 1: JP-A 2010-45059

SUMMARY OF INVENTION

Technical Problem

The present invention has been made in view of the above circumstances, and an object thereof is to provide a composition for forming a PVDF film that provides a PVDF film having a high β-crystallization rate, and a PVDF film obtained from the composition.

Solution to Problem

As a result of intensive studies to achieve the above object, the present inventors have found that a composition containing PVDF, a predetermined surfactant, and a solvent provides a PVDF film having a high β-crystallization rate, thereby completing the present invention.

That is, the present invention provides the following composition for forming a polyvinylidene fluoride film and a polyvinylidene fluoride film.

1. A composition for forming a polyvinylidene fluoride film, containing polyvinylidene fluoride, at least one surfactant selected from sulfuric acid-based surfactants, sulfonic acid-based surfactants and quaternary ammonium salt-type surfactants, and a solvent.
2. The composition for forming a polyvinylidene fluoride film of 1, wherein the surfactant is at least one selected from alkyl sulfates, alkyl sulfonates, alkylbenzene sulfonates, and alkyltrimethylammonium salts.
3. The composition for forming a polyvinylidene fluoride film of 1 or 2, wherein compounding amount of the surfactant is 0.001 to 20 parts by weight per 100 parts by weight of polyvinylidene fluoride.
4. A polyvinylidene fluoride film obtained from the composition for forming a polyvinylidene fluoride film of any one of 1 to 3.
5. The polyvinylidene fluoride film of 4, wherein the polyvinylidene fluoride film includes a β-type crystal structure.
6. The polyvinylidene fluoride film of 5, wherein β-type crystallization rate of the polyvinylidene fluoride is 70 wt % or more.
7. A method for producing a polyvinylidene fluoride film, including performing heat treatment at 55 to 105° C. when a polyvinylidene fluoride film is formed using the composition for forming a polyvinylidene fluoride film of any one of 1 to 3.

Advantageous Effects of Invention

The composition for forming a PVDF film of the present invention provides a PVDF film having a high β-crystallization rate.

DESCRIPTION OF EMBODIMENTS

The composition for forming a PVDF film of the present invention contains PVDF, at least one surfactant selected from sulfuric acid-based surfactants, sulfonic acid-based surfactants and quaternary ammonium salt-type surfactants, and a solvent.

In the present invention, the PVDF preferably has a predetermined viscosity, and examples thereof include PVDF having the following viscosity.

(1) PVDF having a melt viscosity at a melt temperature of 232° C. and a shear rate of 100 sec$^{-1}$, measured in accordance with ASTM D3835, of preferably 2.0 to 60.0 Kpoise, and more preferably 4.0 to 55 Kpoise (2) PVDF having an intrinsic viscosity measured in accordance with ISO 1060-1 of preferably 0.5 to 4.0 dl/g, and more preferably 0.7 to 1.5 dl/g As the surfactant, at least one selected from sulfuric acid-based surfactants, sulfonic acid-based surfactants and quaternary ammonium salt-type surfactants is contained, and in the present invention, it is preferable to contain at least one selected from sulfuric acid-based surfactants and sulfonic acid-based surfactants.

Examples of the sulfuric acid-based surfactant include alkyl sulfates and the like. The number of carbon atoms of the alkyl group contained in these surfactants is preferably 8 to 20, and more preferably 10 to 18. Specific examples thereof include sodium dodecyl sulfate, sodium tetradecyl sulfate, sodium hexadecyl sulfate, sodium octadecyl sulfate, lithium dodecyl sulfate, and the like.

Examples of the sulfonic acid-based surfactant include alkyl sulfonates, alkylbenzene sulfonates, and the like. The number of carbon atoms of the alkyl group contained in these surfactants is preferably 8 to 20, and more preferably 10 to 18. Specific examples thereof include sodium 1-decanesulfonate, sodium dodecylbenzenesulfonate, and the like.

Examples of the quaternary ammonium salt-type surfactant include alkyltrimethylammonium salts and the like. The number of carbon atoms of the alkyl group contained in these surfactants is preferably 8 to 20, and more preferably 10 to 18. Specific examples thereof include hexadecyltrimethylammonium bromide and the like.

Compounding amount of the surfactant is preferably 0.001 to 20 parts by weight, more preferably 0.1 to 15 parts by weight, and still more preferably 1 to 10 parts by weight per 100 parts by weight of PVDF. By setting the compounding amount of the surfactant within the above ranges, a PVDF film having a high β-crystallization rate is obtained.

The solvent is not particularly limited as long as it can dissolve PVDF and a surfactant. Examples of such a solvent include N,N-dimethylformamide (DMF), dimethyl sulfoxide, N-methyl-2 pyrrolidone, triethyl phosphate, tetrahydrofuran, cyclopentyl methyl ether, γ-butyrolactone, cyclopentanone, cyclohexanone, 3-methylcyclohexanone, isophorone, menthone, propylene carbonate, ethylene carbonate, trichloroethane, chlorodifluoromethane, acetone, methyl ethyl ketone, methyl amyl ketone, acetonitrile, N,N-dimethylacetamide, hexamethylphosphoramide, tetramethyl urea, ethyl acetate, acetic acid, pyridine, butyl acetate, polyethylene glycol methyl ether acrylate, sulfolane, 1,4-dioxane, and the like. Among them, DMF, acetone, N,N-dimethylacetamide, N-methyl-2-pyrrolidone, and methyl ethyl ketone are preferable, DMF and acetone are more preferable, and a mixed solvent of DMF and acetone is still more preferable. The solvents may be used singly or in a mixture of two or more kinds thereof.

Use amount of the solvent is preferably 400 to 99,900 parts by weight, more preferably 900 to 19,900 parts by weight, and still more preferably 900 to 9,900 parts by weight per 100 parts by weight of PVDF, from the viewpoint of film formability and solubility.

The degree of crystallinity of PVDF film obtained using the composition for forming a PVDF film of the present invention is preferably 30 wt % or more, more preferably 40 wt % or more, and still more preferably 50 wt % or more in the whole PVDF. When the degree of crystallinity is 50 wt % or more, more excellent ferroelectricity and piezoelectric properties are expected. The upper limit of the degree of crystallinity is 100 wt %, but it is usually about 60 wt %.

The β-crystallization rate of PVDF in the PVDF film is preferably 50 wt % or more, more preferably 65 wt % or more, and still more preferably 75 wt % or more in the crystallized PVDF. When the β-crystallization rate is 75 wt % or more, more excellent ferroelectricity and piezoelectric properties are expected. The upper limit of the β-crystallization rate is 100 wt %, but it is usually about 90 wt %.

When a PVDF film is formed using the composition of the present invention, a known method can be employed, and examples thereof include a solvent casting method, a doctor blade method, a spin coating method, an electrospinning method, a slit coater, a roll coater, an inkjet method, dip coating, screen printing, and the like.

When the PVDF film is formed, heat treatment may be performed as necessary for promoting drying and crystallization. Heating temperature at this time is preferably 55 to 105° C., and more preferably 60 to 100° C. Also, heating time is preferably 1 to 240 minutes, and more preferably 5 to 30 minutes. This heat treatment can increase the β-crystallization rate.

Examples of devices used for heating in the heat treatment include a hot plate, an oven, and the like. Heating atmosphere may be under air or an inert gas, and may be under normal pressure or reduced pressure.

Thickness of PVDF film is usually about 50 nm to 50 μm, preferably about 100 nm to 20 μm, and more preferably about 1 to 10 μm. The film thickness can be adjusted by adjusting the concentration of the composition, film formation conditions, and the like.

The film thickness can be measured with a micrometer, a step profiler (fine shape measuring machine), or the like.

EXAMPLES

Hereinafter, the present invention is more specifically described with reference to Examples and Comparative Examples, but the present invention is not limited to the following Examples. The apparatuses and PVDF used are as follows.

[Apparatus]
(1) Differential scanning calorimetry (DSC):
   "Diamond DSC", manufactured by PerkinElmer Inc.
(2) Fourier transform infrared spectrophotometer 1:
   "IRPrestige-21", manufactured by Shimadzu Corporation, sample chamber integrated single reflection-type total reflection measuring apparatus: MIRacle 10
(3) Fourier transform infrared spectrophotometer 2:
   "Nicolet iS5", manufactured by Thermo Fisher Scientific K.K.

[PVDF]
(1) PVDF1: "kynar 721", manufactured by Arkema, having a melt viscosity at a melt temperature of 232° C. and a shear rate of 100 $sec^{-1}$, measured in accordance with ASTM D3835, of 4.0 to 8.0 Kpoise
(2) PVDF2: "KF Polymer 850", manufactured by KUREHA CORPORATION, having an intrinsic viscosity measured in accordance with ISO 1060-1 of 0.85 dl/g

[1] Preparation of Composition for Forming PVDF Film

[Example 1-1] Preparation of Composition A1

100 parts by weight of PVDF1 was dissolved in a mixed solvent of 450 parts by weight of DMF (manufactured by Junsei Chemical Co., Ltd.) and 450 parts by weight of acetone (manufactured by Junsei Chemical Co., Ltd.), and then 10 parts by weight of sodium dodecyl sulfate ($C_{12}H_{25}SO_4Na$, manufactured by Tokyo Chemical Industry Co., Ltd.) was added thereto and dissolved by stirring the mixture until it became uniform. Subsequently, the obtained solution was filtered through a syringe filter (5 μm) to obtain composition A1.

[Example 1-2] Preparation of Composition B1

Composition B1 was prepared by the same method as in Example 1-1, except that the compounding amount of sodium dodecyl sulfate was changed to 7 parts by weight.

[Example 1-3] Preparation of Composition C1

Composition C1 was prepared by the same method as in Example 1-1, except that the compounding amount of sodium dodecyl sulfate was changed to 5 parts by weight.

[Example 1-4] Preparation of Composition D1

Composition D1 was prepared by the same method as in Example 1-1, except that the compounding amount of sodium dodecyl sulfate was changed to 3 parts by weight.

[Example 1-5] Preparation of Composition E1

Composition E1 was prepared by the same method as in Example 1-1, except that the compounding amount of sodium dodecyl sulfate was changed to 1 part by weight.

[Comparative Example 1-1] Preparation of Composition F1

Composition F1 was prepared by the same method as in Example 1-1, except that sodium dodecyl sulfate was not blended.

[Example 1-6] Preparation of Composition A2

100 parts by weight of PVDF2 was dissolved in a mixed solvent of 950 parts by weight of DMF and 950 parts by weight of acetone, and then 10 parts by weight of sodium dodecyl sulfate was added thereto and dissolved by stirring the mixture until it became uniform. Subsequently, the obtained solution was filtered through a syringe filter (5 µm) to obtain composition A2.

[Example 1-7] Preparation of Composition B2

Composition B2 was prepared by the same method as in Example 1-6, except that the compounding amount of sodium dodecyl sulfate was changed to 7 parts by weight.

[Example 1-8] Preparation of Composition C2

Composition C2 was prepared by the same method as in Example 1-6, except that the compounding amount of sodium dodecyl sulfate was changed to 5 parts by weight.

[Example 1-9] Preparation of Composition D2

Composition D2 was prepared by the same method as in Example 1-6, except that the compounding amount of sodium dodecyl sulfate was changed to 3 parts by weight.

[Example 1-10] Preparation of Composition E2

Composition E2 was prepared by the same method as in Example 1-6, except that the compounding amount of sodium dodecyl sulfate was changed to 0.02 g.

[Comparative Example 1-2] Preparation of Composition F2

Composition F2 was prepared by the same method as in Example 1-6, except that sodium dodecyl sulfate was not blended.

[Example 1-11] Preparation of Composition G 100 parts by weight of PVDF2 was dissolved in a mixed solvent of 950 parts by weight of DMF and 950 parts by weight of acetone, and then 10 parts by weight of sodium tetradecyl sulfate ($C_{14}H_{29}SO_4Na$, manufactured by FUJIFILM Wako Pure Chemical Corporation) was added thereto and dissolved by stirring the mixture until it became uniform. Subsequently, the obtained solution was filtered through a syringe filter (5 µm) to obtain composition G.

[Example 1-12] Preparation of Composition H

Composition H was prepared by the same method as in Example 1-13, except that sodium tetradecyl sulfate was changed to sodium hexadecyl sulfate ($C_{16}H_{33}SO_4Na$, manufactured by FUJIFILM Wako Pure Chemical Corporation).

[Example 1-13] Preparation of Composition I

Composition I was prepared by the same method as in Example 1-13, except that sodium tetradecyl sulfate was changed to sodium octadecyl sulfate ($C_{18}H_{37}SO_4Na$, manufactured by FUJIFILM Wako Pure Chemical Corporation).

[Example 1-14] Preparation of Composition J

Composition J was prepared by the same method as in Example 1-13, except that sodium tetradecyl sulfate was changed to lithium dodecyl sulfate ($C_{12}H_{25}SO_4Li$, manufactured by FUJIFILM Wako Pure Chemical Corporation).

[Example 1-15] Preparation of Composition K

Composition K was prepared by the same method as in Example 1-13, except that sodium tetradecyl sulfate was changed to sodium 1-decanesulfonate ($C_{10}H_{21}SO_3Na$, manufactured by Tokyo Chemical Industry Co., Ltd.).

[Example 1-16] Preparation of Composition L

Composition L was prepared by the same method as in Example 1-13, except that sodium tetradecyl sulfate was changed to hexadecyltrimethylammonium bromide ($[C_{16}H_{33}N(CH_3)_3]Br$, manufactured by FUJIFILM Wako Pure Chemical Corporation).

[Comparative Example 1-3] Preparation of Composition M

Composition M was prepared by the same method as in Example 1-13, except that sodium tetradecyl sulfate was changed to sodium laurate ($C_{11}H_{23}COONa$, manufactured by Tokyo Chemical Industry Co., Ltd.).

[Comparative Example 1-4] Preparation of Composition N

Composition N was prepared by the same method as in Example 1-13, except that sodium tetradecyl sulfate was changed to sodium N-dodecanoylsarcosinate ($C_{11}H_{23}CON(CH_3)CH_2COONa$, manufactured by FUJIFILM Wako Pure Chemical Corporation).

[Comparative Example 1-5] Preparation of Composition O

Composition O was prepared by the same method as in Example 1-13, except that sodium tetradecyl sulfate was changed to sodium monododecyl phosphate ($C_{12}H_{25}PO_4Na_2$, manufactured by Tokyo Chemical Industry Co., Ltd.).

[Comparative Example 1-6] Preparation of Composition P

Composition P was prepared by the same method as in Example 1-13, except that sodium tetradecyl sulfate was changed to dodecyldimethyl(3-sulfopropyl)ammonium hydroxide inner salt ($C_{17}H_{37}NO_3S$, manufactured by Tokyo Chemical Industry Co., Ltd.).

[2] Production of PVDF Film

Example 2-1

300 µL of the composition A1 obtained in Example 1-1 was dropped onto a petri dish (φ 35 mm), and the solution was uniformly spread. Next, the petri dish was heat-treated on a hot plate heated to 80° C. for 5 minutes to perform drying and crystallization, thereby obtaining self-supporting film a1 made of PVDF and having a film thickness of about 10 μm.

Examples 2-2 to 2-4, Comparative Example 2-1

Self-supporting films c1, d1, e1 and f1 made of PVDF and having a film thickness of about 10 μm were obtained by the same method as in Example 2-1, except that the compositions C1, D1 and E1 obtained in Examples 1-3 to 1-5 and the F1 obtained in Comparative Example 1-1 were each used instead of the composition A1.

Example 3-1

The composition A2 obtained in Example 1-6 was dropped onto a glass substrate (100 mm square), and a coating film was formed using a doctor blade (liquid thickness: 100 μm). Next, the obtained coating film was heat-treated on a hot plate heated to 80° C. for 10 minutes to perform drying and crystallization, thereby obtaining self-supporting film a2 made of PVDF and having a film thickness of about 3 μm.

Examples 3-2 to 3-4, Comparative Example 3-1

Self-supporting films b2, c2, d2 and f2 made of PVDF and having a film thickness of about 3 μm were obtained by the same method as in Example 3-1, except that the compositions B2, C2 and D2 obtained in Examples 1-7 to 1-9 and the F2 obtained in Comparative Example 1-2 were each used instead of the composition A2.

Example 4-1

The composition A2 obtained in Example 1-6 was dropped onto a silicon substrate, and a coating film was formed by a spin coating method (990 rpm, 20 sec). Next, the obtained coating film was heat-treated on a hot plate heated to 80° C. for 10 minutes to perform drying and crystallization, thereby obtaining film a3 made of PVDF and having a film thickness of 500 nm.

Examples 4-2 to 4-4, Comparative Example 4-1

Films b3, c3, d3 and f3 made of PVDF and having a thickness of 500 nm were obtained by the same method as in Example 4-1, except that the compositions B2, C2 and D2 obtained in Examples 1-7 to 1-9 and the F2 obtained in Comparative Example 1-2 were each used instead of the composition A2.

Example 5-1

300 μL of the composition G obtained in Example 1-11 was dropped onto a petri dish (φ 35 mm), and the solution was uniformly spread. The petri dish was heat-treated on a hot plate heated to 80° C. for 5 minutes to perform drying and crystallization, thereby obtaining self-supporting film g made of PVDF and having a film thickness of about 10 μm.

Examples 5-2 to 5-6, Comparative Examples 5-1 to 5-4

Self-supporting films h, i, j, k, l, m, n, o and p made of PVDF and having a thickness of about 10 μm were obtained by the same method as in Example 5-1, except that the compositions H, I, J, K and L obtained in Examples 1-12 to 1-16 and the compositions M, N, O and P obtained in Comparative Examples 1-3 to 1-6 were each used instead of the composition G.

Example 6-1

300 μL of the composition A2 obtained in Example 1-6 was dropped onto a petri dish (φ 35 mm), and the solution was uniformly spread. The petri dish was heat-treated on a hot plate heated to 60° C. for 5 minutes to perform drying and crystallization, thereby obtaining self-supporting film a4 made of PVDF and having a film thickness of about 10 μm.

Examples 6-2 to 6-5, Comparative Examples 6-1 to 6-4

Self-supporting films a5 to a12 made of PVDF and having a thickness of about 10 μm were obtained by the same method as in Example 6-1, except that the temperature of the heat treatment was changed to 70° C., 80° C., 90° C., 100° C., 110° C., 120° C., 130° C. and 140° C., respectively.

[3] Evaluation of PVDF Film (1) Evaluation of Degree of Crystallinity of PVDF

The degree of crystallinity of PVDF was determined as follows: a film was cut out so as to be about 5 mg, and an endothermic peak was measured in a temperature range of 30 to 200° C. and a temperature raising rate of 10° C./min, under an air atmosphere, using a differential scanning calorimeter ("Diamond DSC", manufactured by PerkinElmer Inc.). Enthalpy change $\Delta H$ of an object to be measured was calculated from the endothermic peak of the measurement result, and the degree of crystallinity was obtained using the following formula. Here, enthalpy of fusion of pure PVDF crystals: $\Delta H^* = 104.7$ J/g was used.

$$\text{Degree of crystallinity} = \Delta H / \Delta H^* \times 100 [\%]$$

(2) Evaluation of β-Crystallization Rate of PVDF

As to the β-crystallization rate of PVDF, for the films obtained by a casting method and a doctor blade method, the absorbance in the thickness direction of the object to be measured was measured under conditions of a measurement range: 700 to 950 cm$^{-1}$, a number of scans of 16 times, and a resolution of 1 cm$^{-1}$, using a Fourier transform infrared spectrophotometer 1 ("IRPrestige-21", manufactured by Shimadzu Corporation), and the β-crystallization rate ($F(\beta)$) was determined using the following expression. where:

$A_\alpha$: absorbance at 761 cm$^{-1}$
$A_\beta$: absorbance at 840 cm$^{-1}$
$K_\alpha$: absorption coefficient at 761 cm$^{-1}$ (6.1×10$^4$ cm$^2$ mol$^{-1}$)
$K_\beta$: absorption coefficient at 840 cm$^{-1}$ (7.7×10$^4$ cm$^2$ mol$^{-1}$) were used.

$$F(\beta) = \frac{A_\beta}{(K_\beta/K_\alpha)A_\alpha + A_\beta} \qquad [\text{Math. 1}]$$

For the films obtained by a spin coating method, without peeling the film from the silicon substrate, the absorbance in the thickness direction of the object to be measured was measured under conditions of a measurement range of 700 to 4000 cm$^{-1}$, a number of scans of 32 times, and a resolution of 8 cm$^{-1}$, using a Fourier transform infrared spectrophotometer 2 ("Nicolet iS5", manufactured by Thermo Fisher Scientific K.K.). The above expression was used as the calculation formula.

Results are shown in Tables 1 to 5.

TABLE 1

| | | | Film (Solvent cast) | | | | | |
|---|---|---|---|---|---|---|---|---|
| | | Composition | No. | Film thickness (μm) | Surfactant Type | Surfactant Content (pbw) | Heat treatment (°C.) | Degree of crystallinity (%) | β-crystallization rate (%) |
| Example | 2-1 | A1 | a1 | 10 | $C_{12}H_{25}SO_4Na$ | 10 | 80 | 50.3 | 86 |
| | 2-2 | C1 | c1 | 10 | $C_{12}H_{25}SO_4Na$ | 5 | 80 | 54.7 | 85 |
| | 2-3 | D1 | d1 | 10 | $C_{12}H_{25}SO_4Na$ | 3 | 80 | 49.0 | 76 |
| | 2-4 | E1 | e1 | 10 | $C_{12}H_{25}SO_4Na$ | 1 | 80 | 44.8 | 59 |
| Comp. Example | 2-1 | F1 | f1 | 10 | — | 0 | 80 | 45.0 | 39 |

From the results in Table 1, it was confirmed that by adding sodium dodecyl sulfate, a PVDF film having a higher β-crystallization rate than that in the case where sodium dodecyl sulfate was not added is obtained.

TABLE 2

| | | | Film (Doctor blade) | | | | | |
|---|---|---|---|---|---|---|---|---|
| | | Composition | No. | Film thickness (μm) | Surfactant Type | Surfactant Content (pbw) | Heat treatment (°C.) | β-crystallization rate (%) |
| Example | 3-1 | A2 | a2 | 3 | $C_{12}H_{25}SO_4Na$ | 10 | 80 | 89 |
| | 3-2 | B2 | b2 | 3 | $C_{12}H_{25}SO_4Na$ | 7 | 80 | 90 |
| | 3-3 | C2 | c2 | 3 | $C_{12}H_{25}SO_4Na$ | 5 | 80 | 85 |
| | 3-4 | D2 | d2 | 3 | $C_{12}H_{25}SO_4Na$ | 3 | 80 | 77 |
| Comparative Example | 3-1 | F2 | f2 | 3 | — | 0 | 80 | 31 |

From the results in Table 2, it was confirmed that by adding sodium dodecyl sulfate, a PVDF film having a higher β-crystallization rate than that in the case where sodium dodecyl sulfate was not added is obtained.

TABLE 3

| | | | Film (Spin coating) | | | | | |
|---|---|---|---|---|---|---|---|---|
| | | Composition | No. | Film thickness (nm) | Surfactant Type | Surfactant Content (pbw) | Heat treatment (°C.) | Degree of crystallinity (%) | β-crystallization rate (%) |
| Example | 4-1 | A2 | a3 | 500 | $C_{12}H_{25}SO_4Na$ | 10 | 80 | 38.9 | 100 |
| | 4-2 | B2 | b3 | 500 | $C_{12}H_{25}SO_4Na$ | 7 | 80 | 38.7 | 100 |
| | 4-3 | C2 | c3 | 500 | $C_{12}H_{25}SO_4Na$ | 5 | 80 | 34.0 | 82 |
| | 4-4 | D2 | d3 | 500 | $C_{12}H_{25}SO_4Na$ | 3 | 80 | 37.5 | 64 |
| Comp. Example | 4-1 | F2 | f3 | 500 | | 0 | 80 | 31.4 | 23 |

From the results in Table 3, it was confirmed that by adding sodium dodecyl sulfate, a PVDF film having a higher β-crystallization rate than that in the case where sodium dodecyl sulfate was not added is obtained.

TABLE 4

| | | Composition | Film (Solvent cast) No. | Film thickness (μm) | Surfactant Type | Content (pbw) | Heat treatment (° C.) | Degree of crystallinity (%) | β-crystallization rate (%) |
|---|---|---|---|---|---|---|---|---|---|
| Example | 5-1 | G | g | 10 | $C_{14}H_{29}SO_4Na$ | 10 | 80 | 52.5 | 80 |
| | 5-2 | H | h | 10 | $C_{16}H_{33}SO_4Na$ | 10 | 80 | 60.6 | 79 |
| | 5-3 | I | i | 10 | $C_{18}H_{37}SO_4Na$ | 10 | 80 | 58.7 | 80 |
| | 5-4 | J | j | 10 | $C_{12}H_{25}SO_4Li$ | 10 | 80 | 46.3 | 85 |
| | 5-5 | K | k | 10 | $C_{10}H_{21}SO_3Na$ | 10 | 80 | 53.8 | 82 |
| | 5-6 | L | l | 10 | $[C_{16}H_{33}N(CH_3)_3]Br$ | 10 | 80 | 59.7 | 89 |
| Comparative | 5-1 | M | m | 10 | $C_{11}H_{23}COONa$ | 10 | 80 | 52.4 | 36 |
| Example | 5-2 | N | n | 10 | $C_{11}H_{23}CON(CH_3)CH_2COONa$ | 10 | 80 | 51.2 | 32 |
| | 5-3 | O | o | 10 | $C_{12}H_{25}PO_4Na_2$ | 10 | 80 | 51.4 | 32 |
| | 5-4 | P | p | 10 | $C_{17}H_{37}NO_3S$ | 10 | 80 | 48.7 | 34 |

From the results in Table 4, it was confirmed that by adding a surfactant selected from sulfuric acid-based surfactants, sulfonic acid-based surfactants and quaternary ammonium salt-type surfactants, a PVDF film having a high β-crystallization rate is obtained.

TABLE 5

| | | Composition | Film (Solvent cast) No. | Film thickness (μm) | Surfactant Type | Content (pbw) | Heat treatment (° C.) | Degree of crystallinity (%) | β-crystallization rate (%) |
|---|---|---|---|---|---|---|---|---|---|
| Example | 6-1 | A2 | a4 | 10 | $C_{12}H_{25}SO_4Na$ | 10 | 60 | 61.9 | 81 |
| | 6-2 | A2 | a5 | 10 | $C_{12}H_{25}SO_4Na$ | 10 | 70 | 58.6 | 82 |
| | 6-3 | A2 | a6 | 10 | $C_{12}H_{25}SO_4Na$ | 10 | 80 | 55.9 | 81 |
| | 6-4 | A2 | a7 | 10 | $C_{12}H_{25}SO_4Na$ | 10 | 90 | 48.3 | 80 |
| | 6-5 | A2 | a8 | 10 | $C_{12}H_{25}SO_4Na$ | 10 | 100 | 52.7 | 80 |
| Comparative | 6-1 | A2 | a9 | 10 | $C_{12}H_{25}SO_4Na$ | 10 | 110 | 52.9 | 63 |
| Example | 6-2 | A2 | a10 | 10 | $C_{12}H_{25}SO_4Na$ | 10 | 120 | 50.5 | 58 |
| | 6-3 | A2 | a11 | 10 | $C_{12}H_{25}SO_4Na$ | 10 | 130 | 52.1 | 56 |
| | 6-4 | A2 | a12 | 10 | $C_{12}H_{25}SO_4Na$ | 10 | 140 | 49.9 | 55 |

From the results in Table 5, it was confirmed that by setting the temperature of the heat treatment within the range specified in the present invention, a PVDF film having a high β-crystallization rate is obtained.

The invention claimed is:

1. A polyvinylidene fluoride film obtained from a composition, comprising:
   polyvinylidene fluoride (PVDF);
   at least one surfactant selected from the group consisting of sodium dodecyl sulfate, sodium tetradecyl sulfate, sodium hexadecyl sulfate, sodium octadecyl sulfate, lithium dodecyl sulfate, sodium 1-decanesulfonate, sodium dodecylbenzenesulfonate, and hexadecyltrimethylammonium bromide; and
   a solvent,
   wherein the degree of crystallinity of the PVDF film is 30 wt % or more in the whole PVDF,
   wherein the β-crystallization rate of PVDF in the PVDF film is 50 wt % or more in the crystallized PVDF, and
   wherein the film has a thickness of 1 to 10 μm.

2. The polyvinylidene fluoride film according to claim 1, wherein β-type crystallization rate of the polyvinylidene fluoride is 70 wt % or more.

3. The polyvinylidene fluoride film according to claim 1, wherein the solvent is at least one selected from the group consisting of N,N-dimethylformamide, dimethyl sulfoxide, N-methyl-2 pyrrolidone, triethyl phosphate, tetrahydrofuran, cyclopentyl methyl ether, γ-butyrolactone, cyclopentanone, cyclohexanone, 3-methylcyclohexanone, isophorone, menthone, propylene carbonate, ethylene carbonate, trichloroethane, chlorodifluoromethane, acetone, methyl ethyl ketone, methyl amyl ketone, acetonitrile, N,N-dimethylacetamide, hexamethylphosphoramide, tetramethyl urea, ethyl acetate, acetic acid, pyridine, butyl acetate, polyethylene glycol methyl ether acrylate, sulfolane and 1,4-dioxane.

4. The polyvinylidene fluoride film according to claim 1, wherein use amount of the solvent is 400 to 99,900 parts by weight per 100 parts by weight of PVDF.

5. The polyvinylidene fluoride film according to claim 1, wherein compounding amount of the surfactant is 0.001 to 20 parts by weight per 100 parts by weight of polyvinylidene fluoride.

6. The polyvinylidene fluoride film according to claim 1, wherein the degree of crystallinity of PVDF film is about 60 wt % in the whole PVDF.

7. The polyvinylidene fluoride film according to claim 1, wherein the β-crystallization rate of PVDF in the PVDF film is 65 wt % or more in the crystallized PVDF.

8. The polyvinylidene fluoride film according to claim 1, wherein the β-crystallization rate of PVDF in the PVDF film 75 wt % or more in the crystallized PVDF.

9. The polyvinylidene fluoride film according to claim 1, wherein the β-crystallization rate of PVDF in the PVDF film is about 90 wt %.

10. The polyvinylidene fluoride film according to claim 1, wherein the PVDF film is prepared by heating at 55 to 105° C., for 1 to 240 minutes.

11. The polyvinylidene fluoride film according to claim 1, wherein the PVDF film is prepared by heating at 60 to 100° C. for 5 to 30 minutes.

12. A method for producing said polyvinylidene fluoride film according to claim 1, comprising:

forming a film from said composition and performing heat treatment on said film at 55 to 105° C. to produce said polyvinylidene fluoride film.

\* \* \* \* \*